United States Patent [19]
Chen et al.

[11] Patent Number: 5,899,718
[45] Date of Patent: May 4, 1999

[54] METHOD FOR FABRICATING FLASH MEMORY CELLS

[75] Inventors: Hwi-Huang Chen; Joe Ko; Gary Hong, all of Hsinchu, Taiwan

[73] Assignee: United Semiconductor Corp., Taiwan

[21] Appl. No.: 08/859,259

[22] Filed: May 20, 1997

[30] Foreign Application Priority Data

Mar. 13, 1997 [TW] Taiwan ................................. 86103097

[51] Int. Cl.$^6$ ............................................. H01L 21/8247
[52] U.S. Cl. ........................................... 438/264; 438/286
[58] Field of Search ................................. 438/257–267, 438/286

[56] References Cited

U.S. PATENT DOCUMENTS

| | | |
|---|---|---|
| 3,996,597 | 12/1976 | Simko et al. . |
| 4,804,637 | 2/1989 | Smayling et al. . |
| 5,190,887 | 3/1993 | Tang et al. . |
| 5,366,915 | 11/1994 | Kodama . |
| 5,432,106 | 7/1995 | Hong . |
| 5,486,480 | 1/1996 | Chen ........................................ 438/257 |
| 5,518,942 | 5/1996 | Shrivastava ............................. 438/264 |
| 5,641,696 | 6/1997 | Takeuchi ................................. 438/257 |
| 5,712,814 | 1/1998 | Fratin et al. ............................. 365/182 |

*Primary Examiner*—Richard A Booth
*Attorney, Agent, or Firm*—Finnegan, Henderson, Farabow, Garrett & Dunner, L.L.P.

[57] ABSTRACT

A method for fabricating flash memory cells having a DDD structure that prevents leakage current during data erasure, that does not require a high temperature drive-in process, and that easily combines with other logic processes. The method for fabricating the flash memory cells utilizes ion implantation through contact windows to establish heavily doped source and drain regions inside previously formed deeply doped source and drain regions to construct the DDD structure.

12 Claims, 4 Drawing Sheets

METHOD FOR FABRICATING FLASH MEMORY CELLS

BACKGROUND OF THE INVENTION

1. Field of Invention

This invention relates generally to a method for fabricating flash memory cells, and more particularly to a method for fabricating embedded flash memory cells.

2. Description of Related Art

Electrically erasable programmable read-only-memories (EEPROMs) are widely used as memory components for personal computers and electronic equipment. A conventional EEPROM memory cell comprises a floating gate transistor structure that is programmable, erasable and can store data. However, the conventional EEPROM suffers from a slow storage and retrieval time of typically around 150 ns to 200 ns. Recently, a faster EEPROM, such as a flash memory, has been developed having a storage and retrieval time of about 70 ns to 80 ns.

FIG. 1 is a top view showing a transistor memory cell structure of a conventional flash memory, wherein S represents source regions and D represents drain regions. Typically, about 16 memory cells jointly connect to an outlet contact window of the transistor memory cell. FIG. 2 is a cross-sectional view taken along line A—A of FIG. 1 depicting a memory cell of the conventional flash memory. As shown, each memory cell is actually a floating gate transistor comprising a floating gate layer 10, a controlling gate layer 12, a tunneling oxide layer 14, a drain region 16, a source region 18 and a doped source region 20.

A conventional floating gate transistor relies on hot electrons for operation. To store data into memory, high voltages of about 6V and 12V are applied to drain region 16 and controlling gate layer 12, respectively. Accordingly, hot electrons flow out from source region 18 and through tunneling oxide layer 14 near an end of drain region 16, and are injected and trapped inside floating gate layer 10, raising the threshold voltage of the floating gate transistor and storing data. To erase data from the memory, a high voltage of about 12V is applied to source region 18. The trapped electrons inside floating gate layer 10 tunnel through tunneling oxide layer 14 and release therethrough, clearing the data from memory.

Since a high voltage is applied during data erasure, source region 18 needs to be isolated by a less concentrated doped source region 20. This forms a deeply doped drain (DDD) structure that can withstand high voltage and prevent leakage current from the junction. However, fabrication of a deeply doped source region requires a drive-in process having a high temperature of about 950° C. to 1000° C. Hence, conventional flash memory cells cannot be manufactured using submicron or lower fabrication processes, since the high temperature requirement of the drive-in process adversely affects the properties of peripheral transistors, such as, threshold voltage $V_t$, saturated drain current $I_{dsat}$, and punch-through voltage.

SUMMARY OF THE INVENTION

It is an object of this invention to provide a method for fabricating flash memory cells having a DDD structure that prevents leakage current during data erasure, does not require a high temperature drive-in process, and easily combines with other logic processes to provide useful embedded flash memory devices.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

To achieve the objects and in accordance with the purpose of the invention, as embodied and broadly described herein, the invention comprises a method for fabricating flash memory cells comprising steps of: providing a first type silicon substrate having a tunneling oxide layer, a floating gate layer, a dielectric layer and a controlling gate layer sequentially formed on a top surface of the silicon substrate; doping the silicon substrate with second type ions so to form a deeply doped source region and a deeply doped drain region in the silicon substrate; forming an insulating layer covering at least the controlling gate layer, the deeply doped source region and the deeply doped drain region; forming a window in the insulating layer, the window being formed above the deeply doped source and drain regions; using the insulating layer as a mask, doping the silicon substrate with second type ions such that heavily doped source and drain regions are formed above the deeply doped source and drain regions, respectively; and filling the window with a metallic layer.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate one embodiment of the invention and together with the description, serve to explain the principles of the invention. In the drawings.

DESCRIPTION OF THE PREFERRED EMBODIMENT

Reference will now be made in detail to the present preferred embodiment of the invention, an example of which is illustrated in the accompanying drawings. Wherever possible, the same reference numbers will be used throughout the drawings to refer to the same or like parts.

Figure 1:
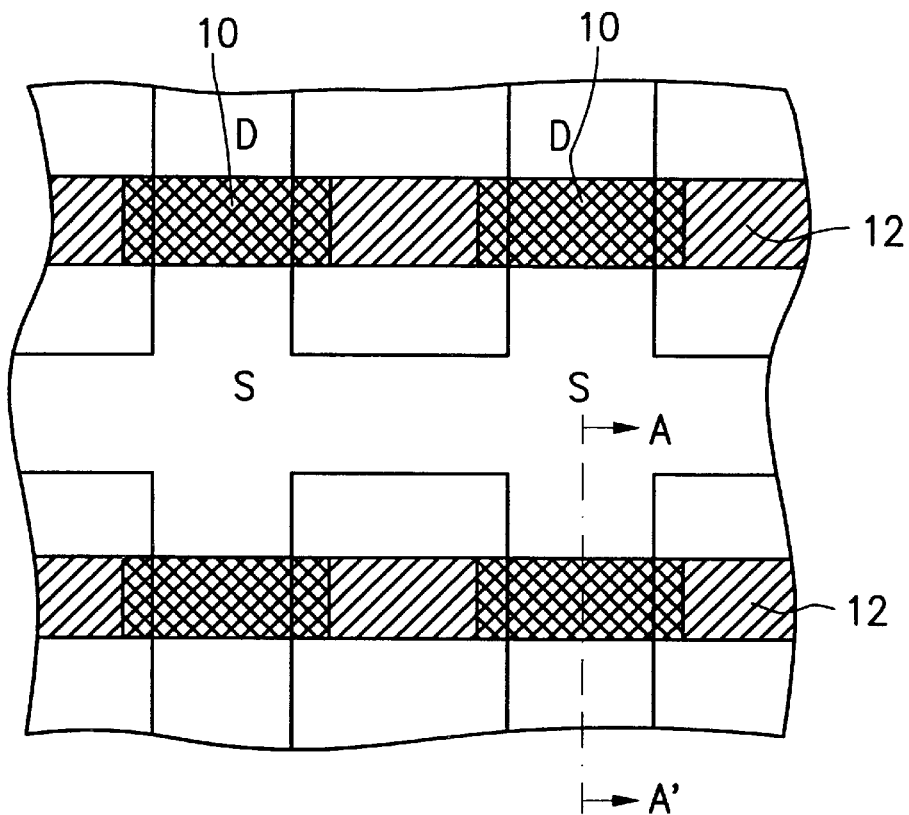
FIG. 1 is a top view showing a conventional flash memory cell.
Figure 2:
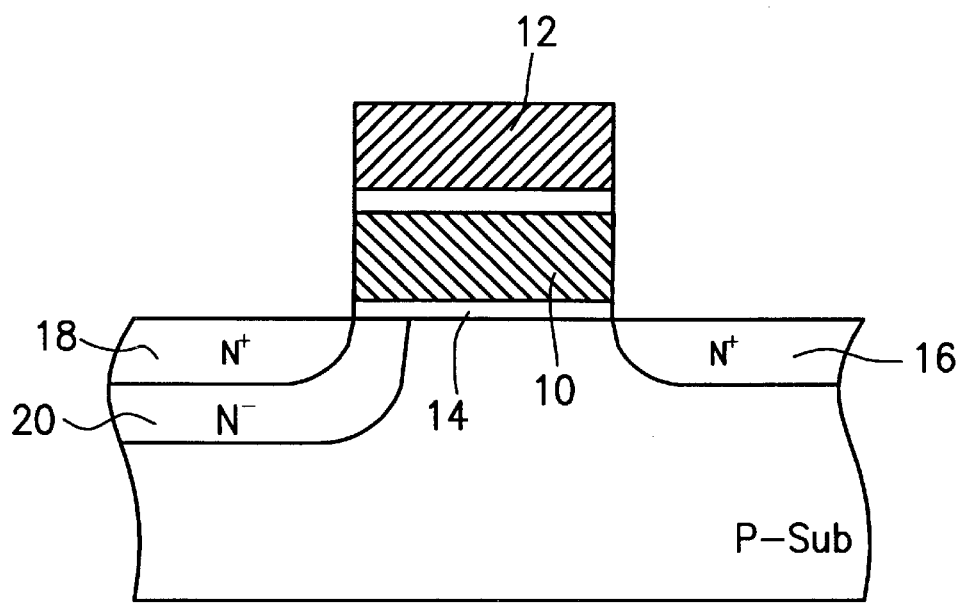
FIG. 2 is a cross-sectional view of the conventional flash memory cell of FIG. 1 taken along line A-A'.
Figure 3A:
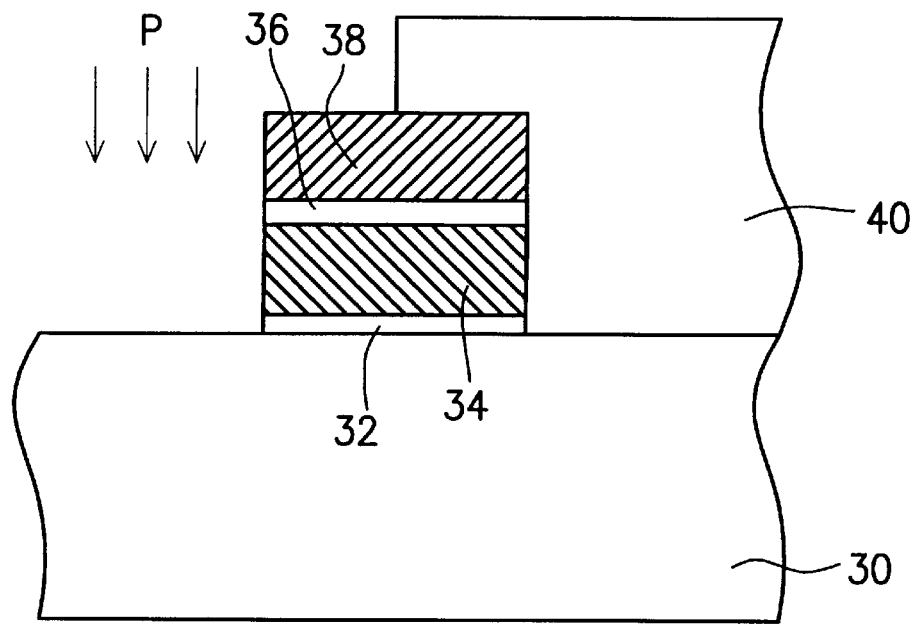
FIGS. 3A–3D are cross-sectional views showing the method for manufacturing a flash memory cell in accordance with a preferred embodiment of the present invention.

Referring to FIG. 3A, the method according to the preferred embodiment of the present invention comprises the step of providing a silicon substrate 30, such as, for example, a P-type silicon substrate. Silicon substrate 30 has a tunneling oxide layer 32, a floating gate layer 34, a dielectric layer 36 and a controlling gate layer 38 sequentially formed above its top surface. The method further includes the step of forming a photoresist layer 40 over silicon substrate 30, and defining photoresist layer 40 so that a surface portion of the surface of substrate 30 is exposed. Using the defined first photoresist layer 40 as a mask, silicon substrate 30 is doped with ions, such as, N-type phosphorus ions having a dosage of about $1 \times 10^{14}$ to $8 \times 10^{14}$ atoms/cm$^2$ and an energy of about 40 to 100 KeV, to form a deeply doped source region 42, as shown in FIG. 3B.

Figure 3B:
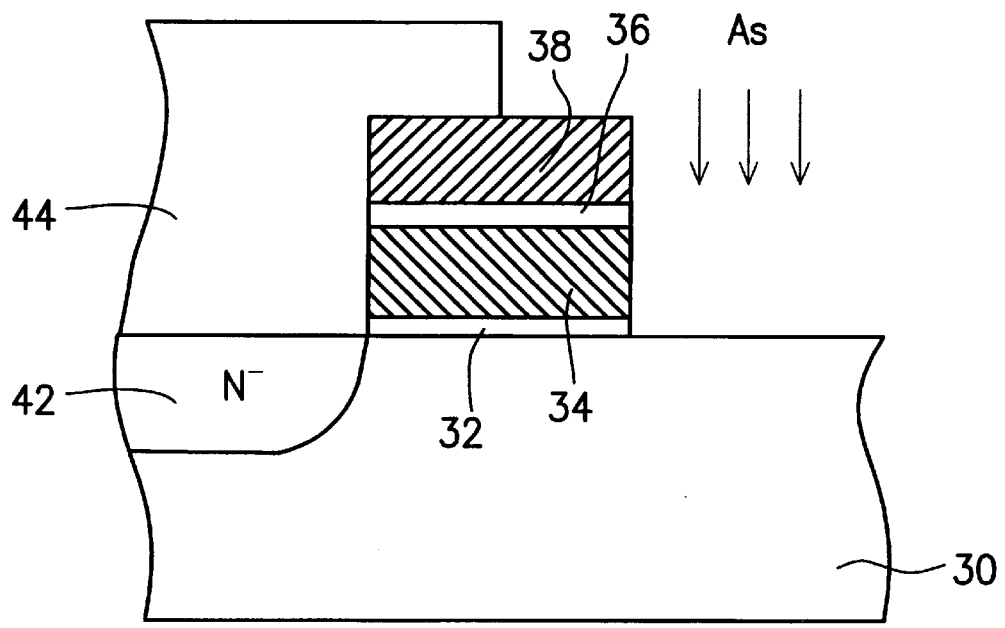

Referring to FIG. 3B, after the removal of first photoresist layer 40, the method includes the step of forming and defining a second photoresist layer 44 on silicon substrate 30 so that another surface portion of substrate 30 is exposed. Using the defined second photoresist layer 44 as a mask, the next step includes doping the silicon substrate 30 with ions, such as, for example, N-type arsenic ions having a dosage of about $3 \times 10^{15}$ to $8 \times 10^{15}$ atoms/cm$^2$ and an energy of about 40 to 100 KeV, to form a deeply doped drain region 46, as shown in FIG. 3C.

Figure 3C:
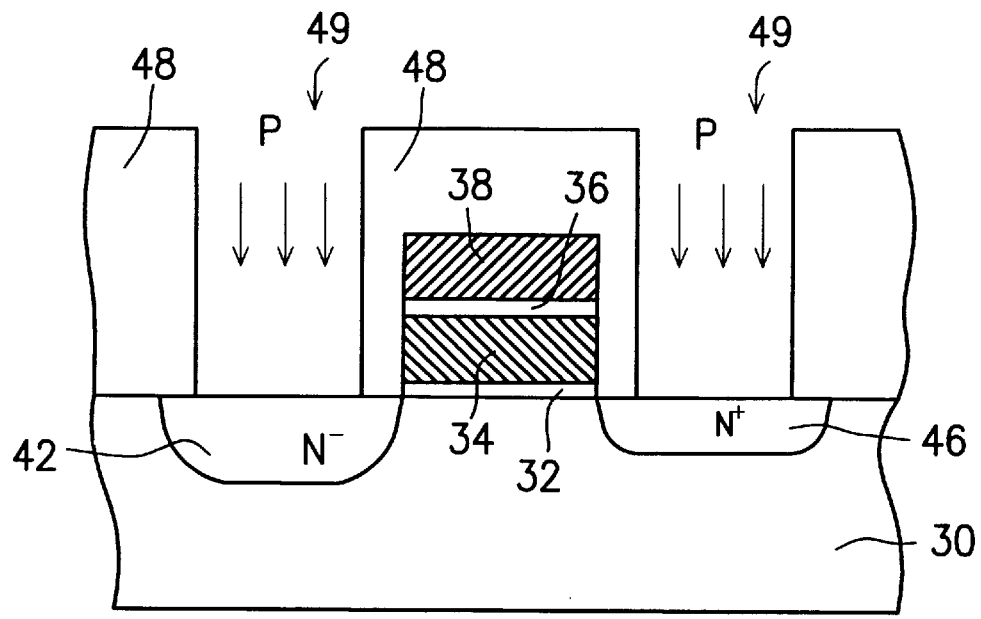

With reference to FIG. 3C, after the removal of the second photoresist layer 44, the next method comprises forming an insulating layer 48, for example, borophosphosilicate glass, above silicon substrate 30 to cover at least controlling gate layer 38, deeply doped source region 42 and deeply doped drain region 46. Next, photolithographic and etching processes define insulating layer 48 to form windows 49 above surface portions of silicon substrate 30, exposing deeply doped source region 42 and deeply doped drain region 46 below. Thereafter, using the insulating layer 48 as a mask, the method comprises the step of doping silicon substrate 30 with ions, such as N-type phosphorus ions having a dosage of about $5 \times 10^{14}$ to $2.5 \times 10^{16}$ atoms/cm$^2$ and an energy of about 40 to 80 KeV, to form a heavily doped source region 52 above deeply doped source region 42, and a heavily doped drain region 50 above deeply doped drain region 46, as shown in FIG. 3D.

Figure 3D:
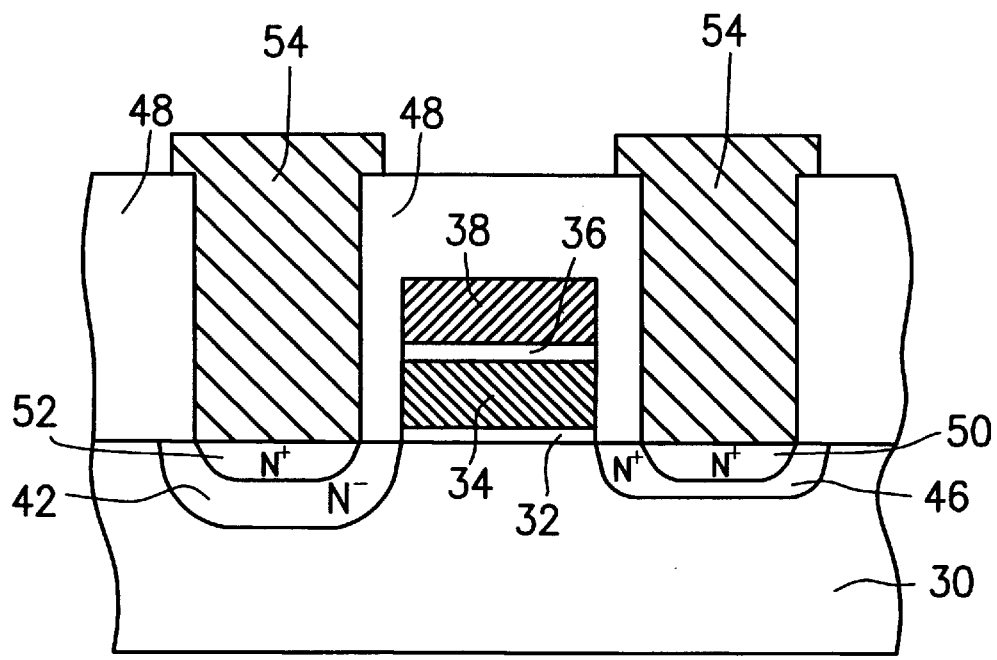

Finally, referring to FIG. 3D, the method also includes the step of filling a metallic layer 54 into windows 49, so that the flash memory unit can integrate with other logic processes and supply support services to the embedded flash memory.

Figure 4:
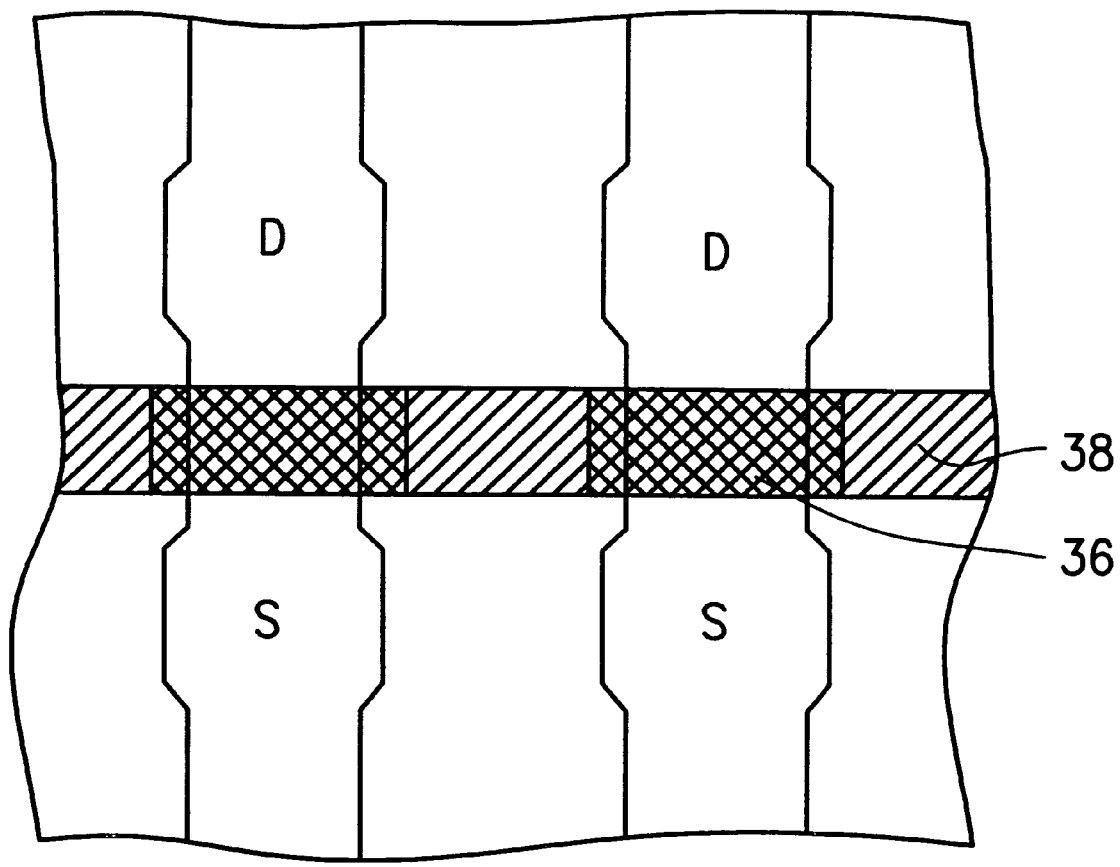
FIG. 4 is a top view showing flash memory cells fabricated in accordance with the preferred embodiment of the present invention.

FIG. 4 is a top view showing the completed flash memory cells, wherein S represents the source regions and D represents the drain regions. As seen in FIG. 4, there is no direct connection linking two adjacent source regions, and hence each source region needs to have an independent contact window for connection with external circuits.

As described above, the flash memory cells fabricated according to the preferred embodiment of the present invention utilizes ion implantation through contact windows to establish the heavily doped source/drain regions inside previously formed deeply doped source/drain regions to construct the DDD structure. The method of the present invention does not require a high temperature drive-in process, and therefore can easily integrate with other logic processes for providing services to the embedded flash memory products.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for fabricating flash memory cells comprising steps of:

providing a first type silicon substrate having a tunneling oxide layer, a floating gate layer, a dielectric layer and a controlling gate layer sequentially formed on a top surface of the silicon substrate;

doping the silicon substrate with second type ions so to form a deeply doped source region and a deeply doped drain region in the silicon substrate;

forming an insulating layer covering at least the controlling gate layer, the deeply doped source region and the deeply doped drain region;

forming a window in the insulating layer, the window being formed above the deeply doped source and drain regions;

using the insulating layer as a mask, doping the silicon substrate with second type ions such that heavily doped source and drain regions are formed above the deeply doped source and drain regions, respectively; and filling the window with a metallic layer.

2. A fabricating method according to claim 1, wherein the first type is a P-type and the second type is an N-type.

3. A fabricating method according to claim 1, wherein the first type is an N-type and the second type is a P-type.

4. A fabricating method according to claim 1, wherein the step of doping the silicon substrate with the second type ions to form the deeply doped source region and the deeply doped drain region comprises the steps of:

forming a first photoresist layer on the silicon substrate and defining the first photoresist layer to expose at a portion of the silicon substrate surface;

using the first photoresist layer as a mask, doping the silicon substrate with second type ions to form the deeply doped source region at the exposed surface portion of the silicon substrate;

forming a second photoresist layer over the silicon substrate, after removal of the first photoresist layer, and defining the second photoresist layer to expose another portion of the silicon substrate surface;

using the second photoresist layer as a mask, doping the silicon substrate with second type ions to form the deeply doped drain region at the exposed another surface portion of the silicon substrate; and removing the second photoresist layer.

5. A fabricating method according to claim 1, wherein the step of doping the silicon substrate with the second type ions to form the deeply doped source region and the deeply doped drain region comprises the steps of:

forming a first photoresist layer over the silicon substrate, and defining the first photoresist layer to expose a portion of the silicon substrate surface;

using the first photoresist layer as a mask, doping the silicon substrate with second type ions to form the deeply doped drain region at the exposed surface portion of the silicon substrate;

forming a second photoresist layer over the silicon substrate, after removal of the first photoresist layer, and defining the second photoresist layer to expose another portion of the silicon substrate surface;

using the second photoresist layer as a mask, doping the silicon substrate with second type ions to form the deeply doped source region at the exposed another surface portion of the silicon substrate; and removing the second photoresist layer.

6. A fabricating method according to claim 1, wherein the second type ions used in the deeply doped source and drain regions formation step include phosphorus ions.

7. A fabricating method according to claim 1, wherein the second type ions used in the deeply doped source and drain regions formation step include phosphorus ions having a doping energy of about 40 to 100 KeV and a doping concentration of about $1\times10^{14}$ to $8\times10^{14}$ atoms/cm$^2$.

8. A fabricating method according to claim 1, wherein the second type ions used in the deeply doped source and drain regions formation step include arsenic ions.

9. A fabricating method according to claim 1, wherein the second type ions used in the deeply doped source and drain regions formation step include arsenic ions having a doping energy of about 40 to 100 KeV and a doping concentration of about $3\times10^{15}$ to $8\times10^{15}$ atoms/cm$^2$.

10. A fabricating method according to claim 1, wherein the insulating layer comprises borophosphosilicate glass.

11. A fabricating method according to claim 1, wherein the second type ions used in the heavily doped source and drain regions formation step include phosphorus ions.

12. A fabricating method according to claim 1, wherein the second type ions used in the heavily doped source and drain regions formation step include phosphorus ions having a doping energy of about 40 to 80 KeV and a doping concentration of about $5\times10^{14}$ to $2.5\times10^{16}$ atoms/cm$^2$.

* * * * *